US012672565B2

(12) United States Patent
Shin et al.

(10) Patent No.: US 12,672,565 B2
(45) Date of Patent: Jun. 30, 2026

(54) PACKAGE SUBSTRATE AND SEMICONDUCTOR PACKAGE INCLUDING THE SAME

(71) Applicant: SAMSUNG ELECTRONICS CO., LTD., Suwon-si (KR)

(72) Inventors: Seongho Shin, Suwon-si (KR); Sangkyu Kim, Suwon-si (KR); Yoonseok Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 520 days.

(21) Appl. No.: 18/124,653

(22) Filed: Mar. 22, 2023

(65) Prior Publication Data

US 2024/0071893 A1 Feb. 29, 2024

(30) Foreign Application Priority Data

Aug. 30, 2022 (KR) ........................ 10-2022-0109048

(51) Int. Cl.
| | |
|---|---|
| *H01L 23/498* | (2006.01) |
| *H10W 42/20* | (2026.01) |
| *H10W 70/65* | (2026.01) |
| *H10W 70/685* | (2026.01) |
| *H10W 70/66* | (2026.01) |
| *H10W 90/00* | (2026.01) |

(52) U.S. Cl.
CPC ........... *H10W 70/65* (2026.01); *H10W 42/20* (2026.01); *H10W 70/685* (2026.01); *H10W 70/66* (2026.01); *H10W 90/701* (2026.01); *H10W 90/724* (2026.01)

(58) Field of Classification Search
None
See application file for complete search history.

(56) References Cited

U.S. PATENT DOCUMENTS

| | | | |
|---|---|---|---|
| 7,994,631 B1* | 8/2011 | Zhang | H01L 23/49822 257/691 |
| 8,227,926 B2 | 7/2012 | Topacio et al. | |
| 9,192,044 B2* | 11/2015 | Hayashi | H01L 23/49827 |
| 9,780,057 B2* | 10/2017 | Pendse | H01L 23/528 |
| 9,864,826 B2* | 1/2018 | Fukuchi | G06F 30/394 |
| 9,881,118 B2 | 1/2018 | Chiu et al. | |

(Continued)

FOREIGN PATENT DOCUMENTS

CN 109743079 A 5/2019

*Primary Examiner* — Long Pham
(74) *Attorney, Agent, or Firm* — Muir Patent Law, PLLC

(57) ABSTRACT

A package substrate includes a plurality of sequentially stacked insulating layers, a first signal line configured to transmit a first signal therethrough, and a ground line. The first signal line including a first signal via at least partially penetrating the plurality of insulating layers, a first signal pad provided at one end of the first signal via in any selected one of the insulating layers, and a first signal wiring extending from the first signal pad in the selected insulating layer. The ground line including a ground via at least partially penetrating the plurality of insulating layers, a ground pad provided at one end of the ground via in the selected insulating layer, a ground wiring extending from the ground pad in the selected insulating layer, and a ground stub extending from the ground pad toward the first signal via or the first signal pad.

18 Claims, 5 Drawing Sheets

(56) References Cited

U.S. PATENT DOCUMENTS

| | | | | |
|---|---|---|---|---|
| 9,984,969 | B2 * | 5/2018 | Yu | H01L 21/0228 |
| 10,433,421 | B2 * | 10/2019 | Zhang | H05K 1/113 |
| 10,651,525 | B2 * | 5/2020 | Elsherbini | H01P 3/02 |
| 10,784,204 | B2 | 9/2020 | Aygun et al. | |
| 11,243,573 | B2 * | 2/2022 | Hsu | G09F 9/301 |
| 11,823,912 | B2 * | 11/2023 | Chen | H01L 24/11 |
| 2016/0300806 | A1 * | 10/2016 | Kim | H01L 23/291 |
| 2020/0066641 | A1 * | 2/2020 | Aygun | H01L 23/50 |
| 2020/0219825 | A1 | 7/2020 | Lee et al. | |
| 2020/0243433 | A1 * | 7/2020 | Zhao | H10B 12/00 |
| 2021/0333834 | A1 * | 10/2021 | Hsu | G02F 1/13452 |
| 2022/0013442 | A1 | 1/2022 | Chen et al. | |
| 2022/0181288 | A1 * | 6/2022 | Choi | H01L 25/105 |
| 2023/0275047 | A1 * | 8/2023 | Chen | H01L 24/94 |

* cited by examiner

FIG. 2

PACKAGE SUBSTRATE AND SEMICONDUCTOR PACKAGE INCLUDING THE SAME

CROSS-REFERENCE TO RELATED APPLICATION

This application claims priority under 35 U.S.C. § 119 to Korean Patent Application No. 10-2022-0109048, filed on Aug. 30, 2022, in the Korean Intellectual Property Office (KIPO), the contents of which are herein incorporated by reference in their entirety.

BACKGROUND

1. Field

Example embodiments relate to a package substrate and a semiconductor package including the same. More particularly, example embodiments relate to a package substrate including a plurality of semiconductor chips and a semiconductor package including the same.

2. Description of the Related Art

As semiconductor memory module products require higher specifications, density between signals in semiconductor products increases. Accordingly, crosstalk, which is an interference phenomenon, occurs between signals. The crosstalk may distort the signal and may degrade the characteristics of the product.

SUMMARY

According to example embodiments, a package substrate includes a plurality of sequentially stacked insulating layers, a first signal line configured to transmit a first signal therethrough, and a ground line. The first signal line including a first signal via at least partially penetrating the plurality of insulating layers, a first signal pad provided at one end of the first signal via in any selected one of the insulating layers, and a first signal wiring extending from the first signal pad in the selected insulating layer. The ground line including a ground via at least partially penetrating the plurality of insulating layers, a ground pad provided at one end of the ground via in the selected insulating layer, a ground wiring extending from the ground pad in the selected insulating layer, and a ground stub extending from the ground pad toward the first signal via or the first signal pad.

According to example embodiments, a semiconductor package includes a package substrate and at least one semiconductor device disposed on the package substrate. The package substrate includes a redistribution layer having a plurality of sequentially stacked insulating layers, a first signal line configured to transmit a first signal to the semiconductor device, and a ground line. The first signal line including a first signal via at least partially penetrating the plurality of insulating layers, a first signal pad provided at one end of the first signal via in any selected one of the insulating layers, and a first signal wiring extending from the first signal pad to the selected insulating layer. The ground line including a ground via at least partially penetrating the plurality of insulating layers, a ground pad provided at one end of the ground via in the selected insulating layer, a ground wiring extending from the ground pad to the selected insulating layer, and a ground stub extending from the ground pad toward the first signal via or the first signal pad.

According to example embodiments, a package substrate includes a plurality of sequentially stacked insulating layers, a first signal line configured to transmit a first signal therethrough, a second signal line configured to transmit a second signal therethrough, and a ground line. The first signal line including a first signal via at least partially penetrating the plurality of insulating layers, a first signal pad provided at one end of the first signal via in any selected one of the insulating layers, and a first signal wiring extending from the first signal pad in the selected insulating layer. The second signal line including a second signal via at least partially penetrating the plurality of insulating layers, a second signal pad provided at one end of the second signal via in the selected insulating layer, and a second signal wiring extending from the second signal pad in the selected insulating layer. The ground line including a ground via at least partially penetrating the plurality of insulating layers, a ground pad provided at one end of the ground via in the selected insulating layer, a ground wiring extending from the ground pad in the selected insulating layer, and a ground stub extending from the ground pad toward the first signal pad or the second signal pad between the first and second signal lines to reduce noise of the first and second signal lines. Each of the first and second signals has a wavelength of a predetermined operating frequency. A ratio (L/λ) of a length (L) of the ground stub to the wavelength (λ) is within a range of 0.005 to 0.05.

According to example embodiments, a package substrate may include a plurality of sequentially stacked insulating layers, a first signal line configured to transmit a first signal therethrough, and a ground line. The first signal line may include a first signal via at least partially penetrating the plurality of insulating layers, a first signal pad provided at one end of the first signal via in any selected one of the insulating layers, and a first signal wiring extending from the first signal pad in the selected insulating layer. The ground line may include a ground via at least partially penetrating the plurality of insulating layers, a ground pad provided at one end of the ground via in the selected insulating layer, a ground wiring extending from the ground pad in the selected insulating layer, and a ground stub extending from the ground pad toward the first signal via or the first signal pad.

BRIEF DESCRIPTION OF THE DRAWINGS

Features will become apparent to those of skill in the art by describing in detail exemplary embodiments with reference to the attached drawings, in which:

FIG. 2 is a cross-sectional view taken along the line A-A' in FIG. 1.

DETAILED DESCRIPTION

Figure 1:
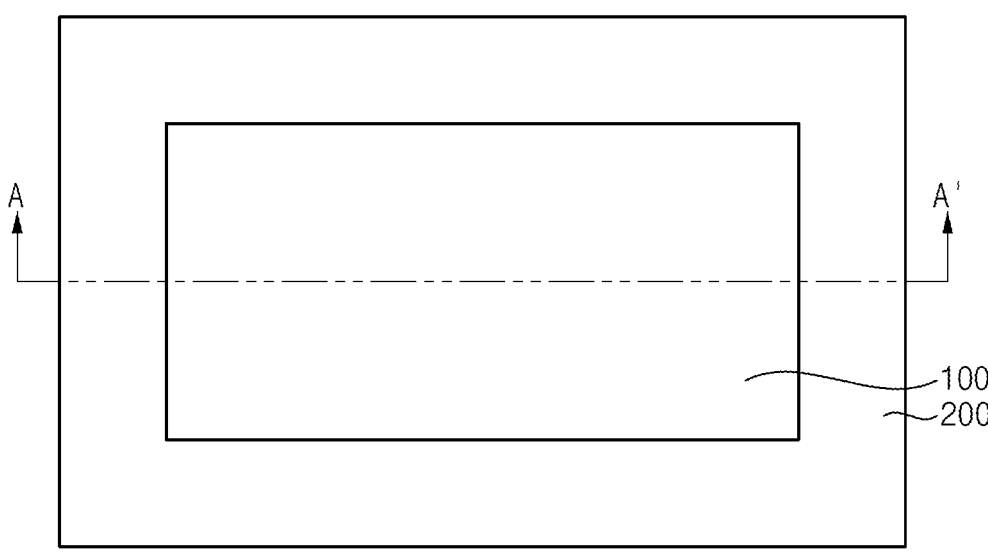
FIG. 1 is a plan view illustrating a semiconductor package in accordance with example embodiments.
Figure 2:
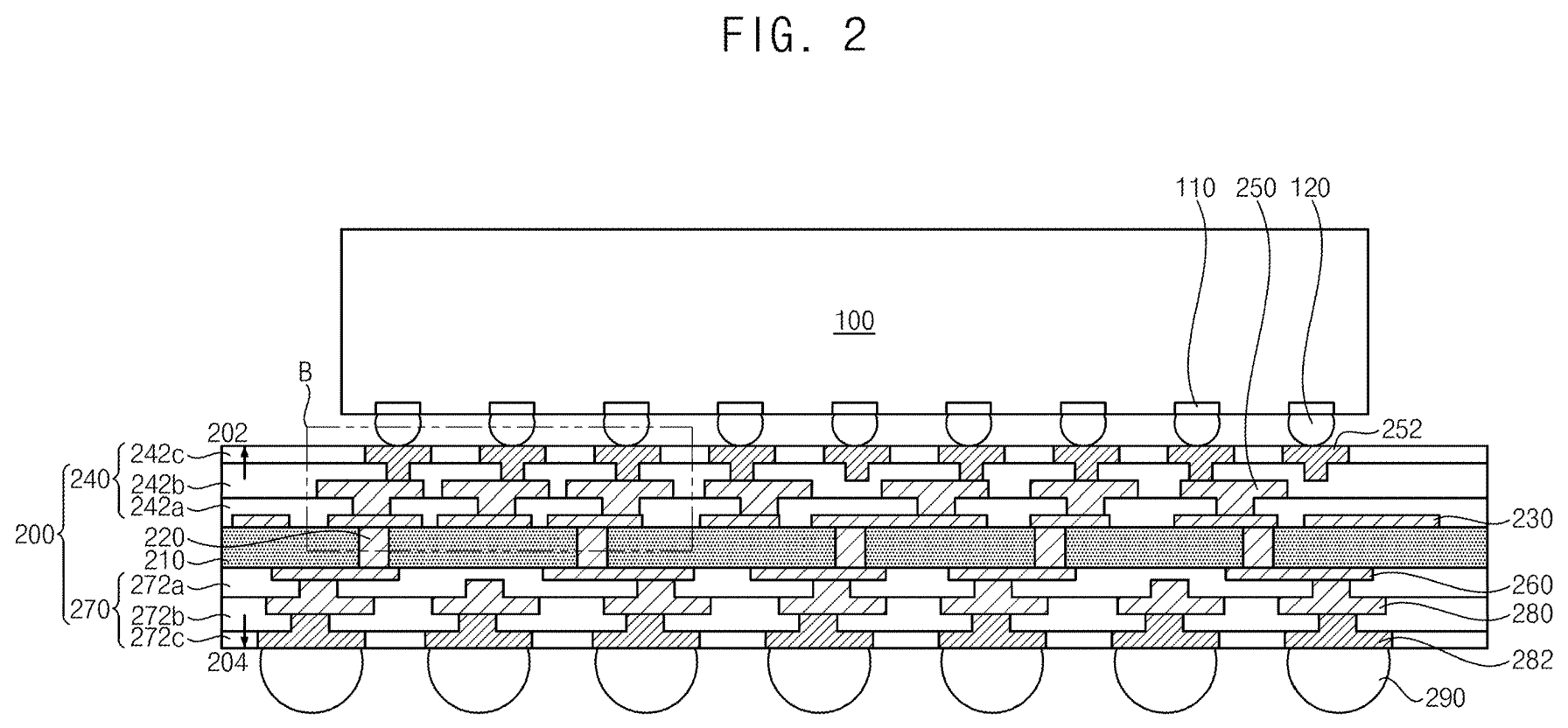
Figure 3:
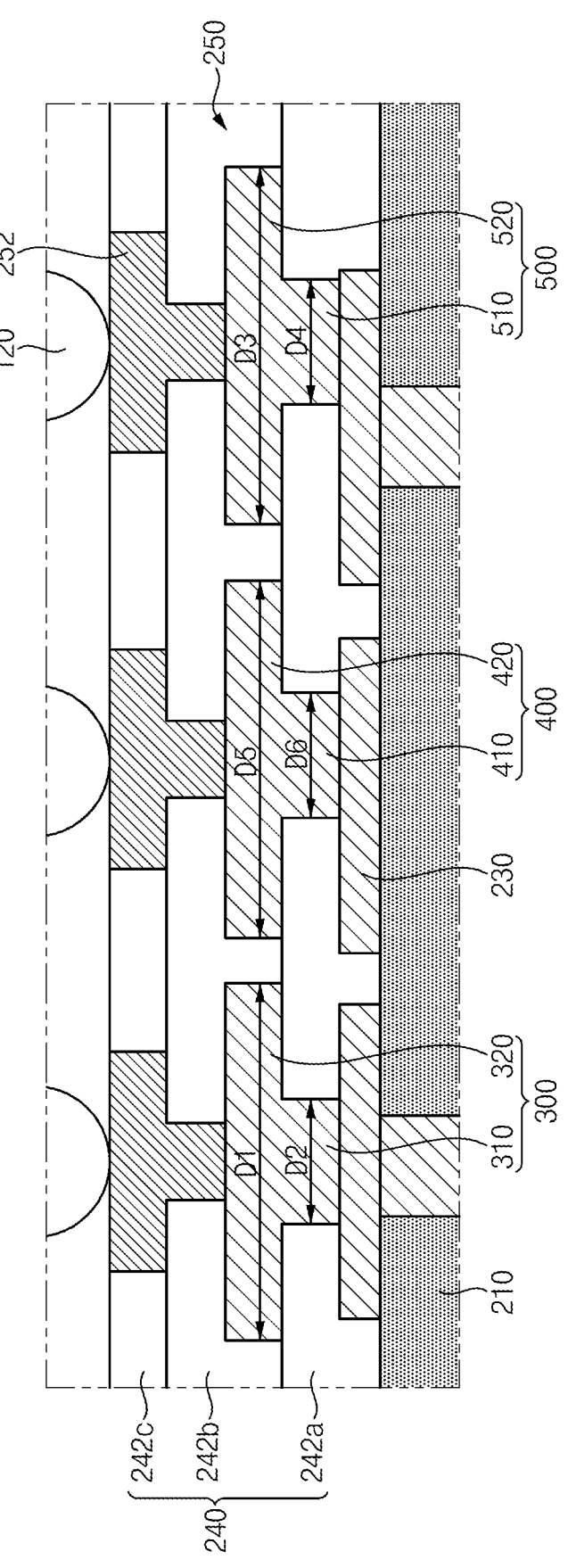
FIG. 3 is an enlarged cross-sectional view illustrating portion 'B' in FIG. 2.
Figure 4:
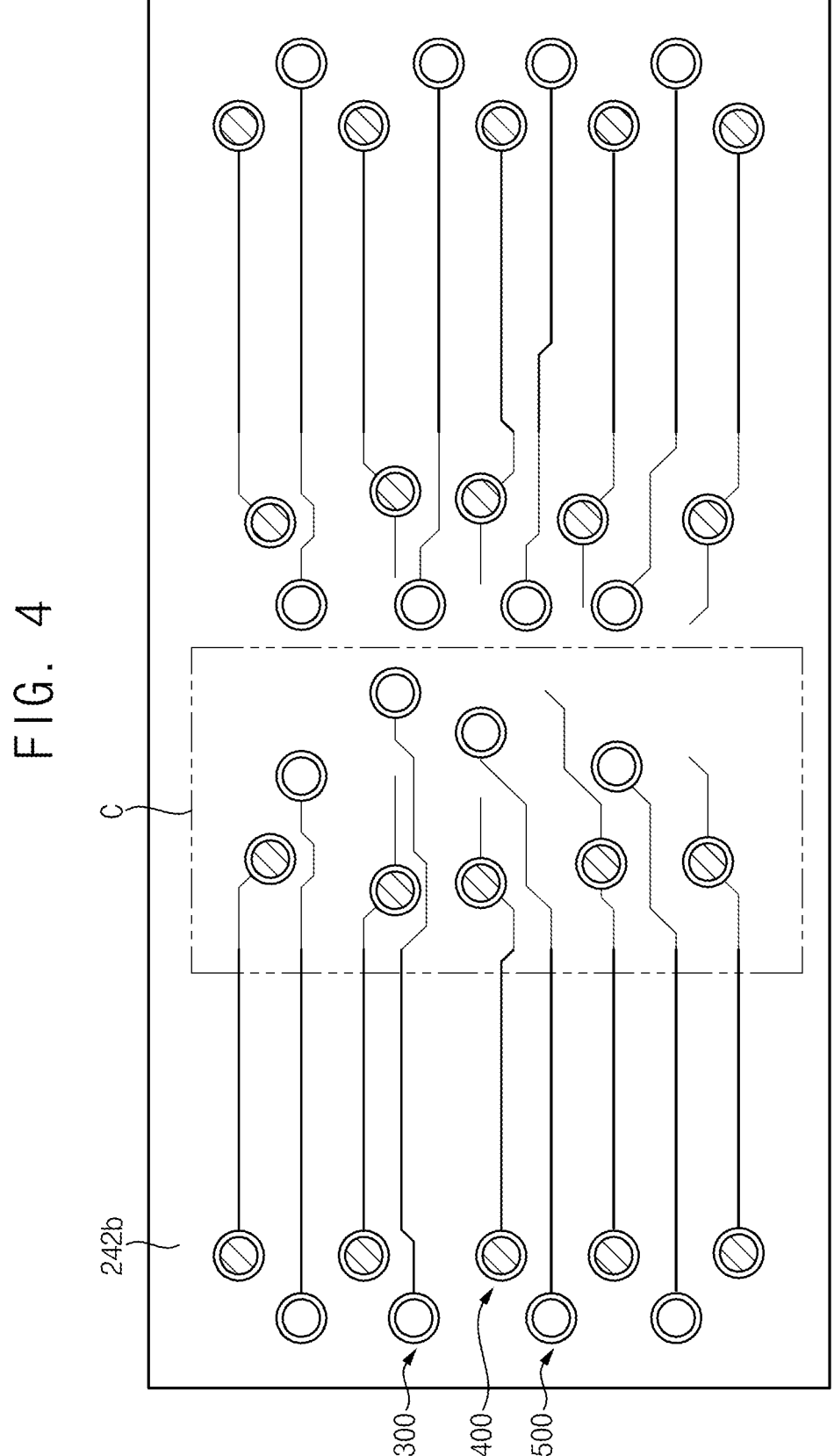
FIG. 4 is a plan view illustrating upper conductive lines in an upper insulating layer.
Figure 5:
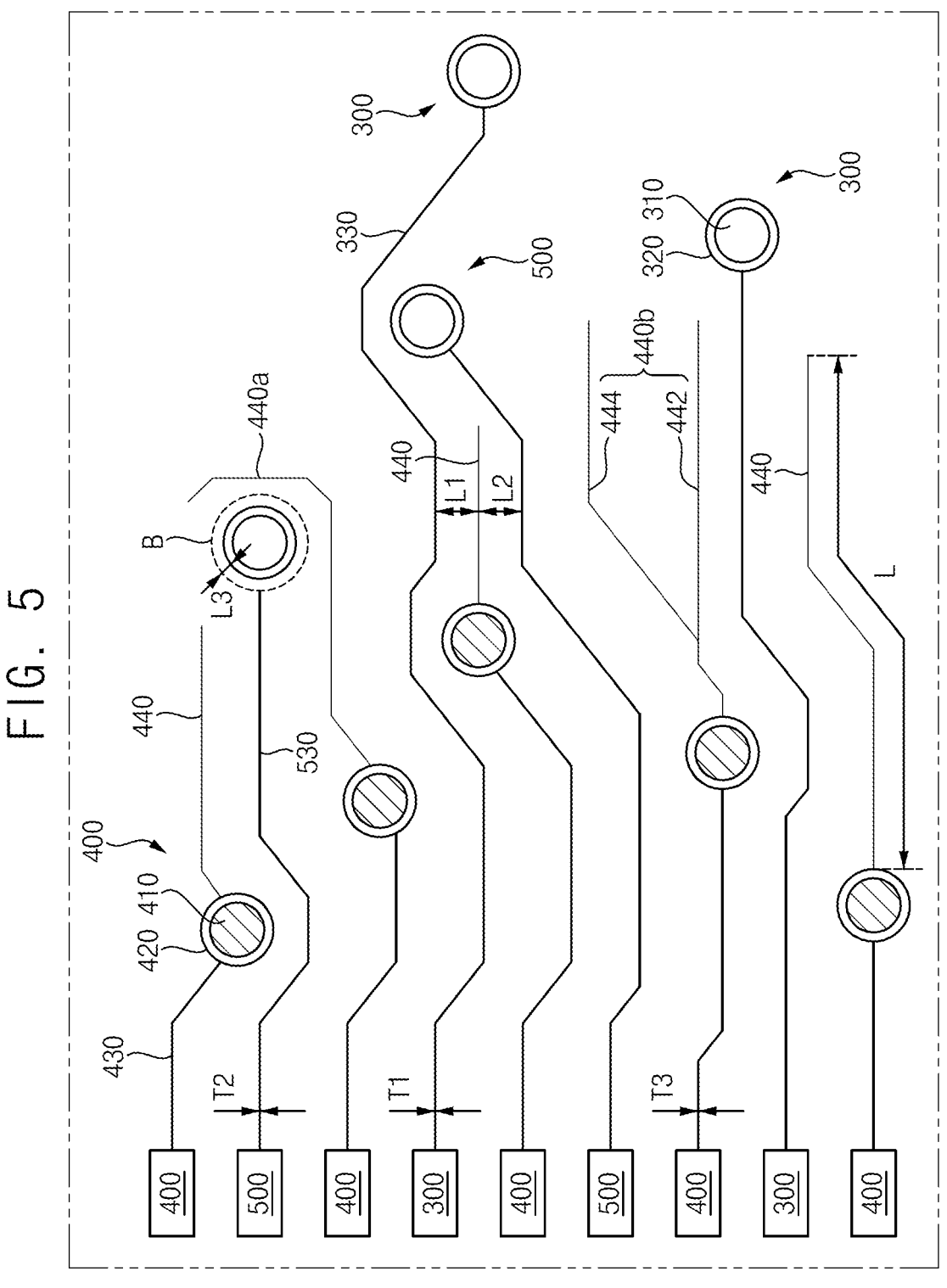
FIG. 5 is an enlarged cross-sectional view illustrating portion 'C' in FIG. 4.

FIG. 1 is a plan view illustrating a semiconductor package in accordance with example embodiments. FIG. 2 is a cross-sectional view taken along line A-A' in FIG. 1. FIG. 3 is an enlarged cross-sectional view illustrating portion 'B' in FIG. 2. FIG. 4 is a plan view illustrating upper conductive lines in an upper insulating layer. FIG. 5 is an enlarged cross-sectional view illustrating portion 'C' in FIG. 4.

Referring to FIGS. 1 to 5, a semiconductor package 10 may include a package substrate 200 and a semiconductor chip 100 disposed on the package substrate 200. In example embodiments, the semiconductor chip 100 may be mounted on the package substrate 200.

In detail, as illustrated in FIG. 2, the semiconductor chip 100 may be electrically connected to the package substrate 200 by solder bumps 120 (e.g., a conductive bump) provided on chip pads 110. The solder bumps 120 may be bonded to substrate pads 252 of the package substrate 200. The semiconductor chip 100 may communicate data signals and control signals through the solder bumps 120. An underfill material layer may be provided between the semiconductor chip 100 and the package substrate 200. For example, the underfill material layer may include a resin material, e.g., epoxy resin or silicone resin.

In example embodiments, the package substrate 200 may include an upper surface 202 and a lower surface 204 that are opposite to each other. The semiconductor chip 100 may be arranged on the upper surface 202 of the package substrate 200. For example, the package substrate 200 may be a printed circuit board (PCB). The PCB may be a multilayer circuit board having vias and various circuits therein.

The package substrate 200 may include a core layer 210, conductive through vias 220, an upper conductive pattern 230, an upper insulating layer 240, an upper conductive line 250, a plurality of upper substrate pads 252, a lower conductive pattern 260, a lower insulating layer 270, a lower conductive line 280, a plurality of lower substrate pads 282, and a plurality of external connection bumps 290.

The core layer 210 may include a non-conductive material layer. The core layer 210 may include a reinforced polymer or the like. The core layer 210 may serve as a boundary portion that divides the package substrate 200 into an upper portion and a lower portion.

The conductive through vias 220 may penetrate through the core layer 210 and electrically connect the upper conductive pattern 230 and the lower conductive pattern 260. When the semiconductor chip 100 is mounted on the upper surface 202 of the package substrate 200, the conductive through vias 220 may electrically connect the semiconductor chip 100 and other semiconductor devices provided on the lower surface 204 of the package substrate 200.

The upper insulating layer 240 may include first to third upper insulating layers 242a, 242b, and 242c, e.g., the first to third upper insulating layers 242a, 242b, and 242c may be sequentially stacked on top of each other to define a redistribution layer. The upper insulating layer 240 may include, e.g., a polymer or a dielectric layer. The upper insulating layer 240 may be formed by, e.g., a vapor deposition process, a spin coating process, or the like.

The upper conductive pattern 230 may be provided in the upper insulating layer 240. In particular, the upper conductive pattern 230 may be provided in the first upper insulating layer 242a. A lower surface of the upper conductive pattern 230 may be exposed from, e.g., through, the first upper insulating layer 242a, e.g., lower surfaces of the upper conductive pattern 230 and the first upper insulating layer 242a may be coplanar and in direct contact with the core layer 210. The upper conductive pattern 230 may extend in a longitudinal direction of the core layer 210 within the first upper insulating layer 242a. The lower surface of the upper conductive pattern 230 may contact the core layer 210.

The first upper insulating layer 242a may have a first opening that exposes the upper conductive pattern 230. The upper conductive line 250 may be provided on the first upper insulating layer 242a and may contact the upper conductive pattern 230 through the first opening.

The second upper insulating layer 242b may be provided on the first upper insulating layer 242a and may have a second opening that exposes the upper conductive line 250. The upper substrate pad 252 may be provided on the second upper insulating layer 242b and may contact the upper conductive line 250 through the second opening.

The third upper insulating layer 242c may be provided on the second upper insulating layer 242b and may have a third opening that exposes the upper substrate pad 252. Accordingly, the plurality of upper substrate pads 252 may be exposed from, e.g., through, the upper surface of the third upper insulating layer 242c. For example, the third upper insulating layer 242c may be a passivation layer on a topmost layer (e.g., the second upper insulating layer 242b) of the upper insulating layer 240.

For example, the upper conductive pattern 230, the upper conductive line 250, and the upper substrate pad 252 may include aluminum (Al), copper (Cu), tin (Sn), nickel (Ni), gold (Au), platinum (Pt), or an alloy thereof. The upper conductive pattern 230, the upper conductive line 250, and the upper substrate pad 252 may be formed by, e.g., a plating process, an electroless plating process, a vapor deposition process, or the like.

The lower insulating layer 270 may include first to third lower insulating layers 272a, 272b, and 272c. The lower insulating layer 270 may include, e.g., a polymer or a dielectric layer. The lower insulating layer 270 may be formed by, e.g., a vapor deposition process, a spin coating process, or the like.

The lower conductive pattern 260 may be provided in the lower insulating layer 270. In particular, the lower conductive pattern 260 may be provided in the first lower insulating layer 272a. A lower surface of the lower conductive pattern 260 may be exposed from, e.g., through, the first lower insulating layer 272a. The lower conductive pattern 260 may extend in the longitudinal direction of the core layer 210 within the first lower insulating layer 272a. The lower surface of the lower conductive pattern 260 may, e.g., directly, contact the core layer 210.

The first lower insulating layer 272a may have a fourth opening that exposes the lower conductive pattern 260. The lower conductive line 280 may be provided on the first lower insulating layer 272a and may contact the lower conductive pattern 260 through the fourth opening.

The second lower insulating layer 272b may be provided on the first lower insulating layer 272a and may have a fifth opening that exposes the lower conductive line 280. The lower substrate pad 282 may be provided on the second lower insulating layer 272b and may contact the lower conductive line 280 through the fifth opening.

The third lower insulating layer 272c may be formed on the second lower insulating layer 272b and may have a sixth opening that exposes the lower substrate pad 282. Accordingly, the plurality of lower substrate pads 282 may be exposed from, e.g., through, the upper surface of the third lower insulating layer 272c.

For example, the lower conductive pattern 260, the lower conductive line 280, and the lower substrate pad 282 may include aluminum (Al), copper (Cu), tin (Sn), nickel (Ni), gold (Au), platinum (Pt), or an alloy thereof. The lower conductive pattern 260, the lower conductive line 280, and the lower substrate pad 282 may be formed by, e.g., a plating process, an electroless plating process, a vapor deposition process, or the like.

The lower substrate pads 282 may be exposed from, e.g., through, the lower surface 204 of the package substrate 200, and the external connection bumps 290 may be disposed on the lower substrate pads 282 to electrically connect to external devices. For example, the external connection bump 290 may be a solder ball. The semiconductor package 10 may be mounted on a module substrate via the solder balls to constitute a semiconductor module.

Although it is not illustrated in the figures, the upper and lower insulating layers 240 and 270 may further include a plurality of additional insulating layers. Hereinafter, a case in which the upper insulating layer 240 includes the first to third upper insulating layers 242a, 242b, 242c, and a case in which the lower insulating layer 270 includes the first to third lower insulating layers 272a, 272b, 272c will be described. It may be understood that the package substrate according to example embodiments is not limited to include only the first to third upper insulating layers 242a, 242b, 242c and the first to third lower insulating layers 272a, 272b, 272c.

In example embodiments, the upper conductive line 250 may include first and second signal lines 300 and 500 configured to transmit signals within the package substrate 200, and a ground line 400 that compensates for noise and provides a return path for the first and second signal lines 300 and 500. The upper conductive line 250 may further include a power line configured to supply power within the package substrate 200 and a strobe line configured to transmit a strobe signal. For example, the first and second signal lines 300 and 500 may include a data line and the strobe line.

In example embodiments, the first signal line 300 may be referred to as the data line configured to transmit data. The first signal line 300 may transmit a first signal within the package substrate 200. The first signal line 300 may be provided in the upper insulating layer 240. The first signal line 300 may include a first signal via 310 at least partially penetrating the upper insulating layer 240, a first signal pad 320 provided on the first upper insulating layer 242a, and a first signal wiring 330 extending from the first signal pad 320 on the first upper insulating layer 242a. For example, the lower conductive line 280 may include the first signal line 300. The first signal line 300 in the lower conductive line 280 may be provided to have a same structure in the lower insulating layer 270 as in the upper conductive line 250 within the upper insulating layer 240.

In example embodiments, the upper substrate pad 252 to which the solder bump 120 of the semiconductor chip 100 is attached may be provided on the first signal line 300. For example, the first and second signal lines 300 and 500 and the ground line 400 may be provided in a conductive layer closest to the substrate pad among conductive layers. As will be described later, a ground stub of the ground line 400 may provide a signal return path and may reduce noise in the conductive layer closest to the substrate pads.

The first signal pad 320 may be provided on the first upper insulating layer 242a. The first signal pad 320 may be electrically connected to other signal pads through the first signal via 310 or the first signal wiring 330. For example, the upper substrate pad 252 contacting the solder bump 120 may be provided on the first signal pad 320. A diameter D1 of the first signal pad 320 may be within a range of 50 µm to 150 µm.

The first signal via 310 may be provided in the first opening penetrating the first upper insulating layer 242a. The first signal via 310 may electrically connect different signal pads provided on different insulating layers. For example, one end of the first signal via 310 may be connected to the first signal pad 320 and the other end of the first signal via 310 may be connected to the upper conductive pattern 230. Alternatively, the other end of the first signal via 310 may be connected to the signal pad provided in the other insulating layer. For example, a diameter D2 of the first signal via 310 may be within a range of 20 µm to 80 µm, e.g., the diameter D2 may be smaller than the diameter D1.

The first signal wiring 330 may horizontally extend from the first signal pad 320 inside the second upper insulating layer 242b. The first signal wiring 330 may electrically connect the first signal pad 320 to different pads provided in the second upper insulating layer 242b. The first signal wiring 330 may electrically connect the first signal pad 320 and the first signal via 310. For example, a width (e.g., thickness) T1 of the first signal wiring 330 may be within a range of 10 µm to 20 µm.

The first signal transmitting through the first signal line 300 may have a wavelength of a predetermined operating frequency. The operating frequency may be a minimum period at which an electrical operation is performed.

In example embodiments, the second signal line 500 may be referred to as the data line configured to transmit the data. The second signal line 500 may transmit a second signal within the package substrate 200. The second signal line 500 may be provided in the upper insulating layer 240. The second signal line 500 may include a second signal via 510 at least partially penetrating the upper insulating layer 240, a second signal pad 520 provided on the first upper insulating layer 242a, and a second signal wiring 530 extending from the second signal pad 520 on the first upper insulating layer 242a. For example, the lower conductive line 280 may include the second signal line 500. The second signal line 500 may be provided to have a same structure in the lower insulating layer 270 as in the upper insulating layer 240.

The second signal line 500 may be positioned to have the ground line 400 between the first signal line 300 and the second signal line 500. The ground line 400 may be provided between the first and second signal lines 300 and 500. For example, the first and second signal lines 300 and 500 may include independently nickel (Ni), antimony (Sb), bismuth (Bi), zinc (Zn), indium (In), palladium (Pd), and platinum. (Pt), aluminum (Al), copper (Cu), molybdenum (Mo), titanium (Ti), gold (Au), silver (Ag), chromium (Cr), tin (Sn), etc.

The second signal pad 520 may be provided on the first upper insulating layer 242a. The second signal pad 520 may be electrically connected to other signal pads through the second signal via 510 or the second signal wiring 530. The second signal pad 520 may be provided in the same insulating layer as the first signal pad 320. For example, the upper substrate pad 252 contacting the solder bump 120 may be provided on the second signal pad 520. A diameter D3 of the second signal pad 520 may be within a range of 50 µm to 150 µm.

The second signal via 510 may be provided in the first opening penetrating the first upper insulating layer 242a. The second signal via 510 may electrically connect different signal pads provided on different insulating layers. For example, one end of the second signal via 510 may be connected to the second signal pad 520 and the other end of the second signal via 510 may be connected to the upper conductive pattern 230. Alternatively, the other end of the second signal via 510 may be connected to the signal pad provided in the other insulating layer. For example, a diameter D4 of the second signal via 510 may be within a range of 20 μm to 80 μm.

The second signal wiring 530 may horizontally extend from the second signal pad 520 inside the second upper insulating layer 242*b*. The second signal wiring 530 may electrically connect the second signal pad 520 to different pads provided inside the second upper insulating layer 242*b*. The second signal wiring 530 may electrically connect the second signal pad 520 and the second signal via 510. For example, a width T2 of the second signal wiring 530 may be within a range of 10 μm to 20 μm. The second signal wiring 530 may be provided in the same insulating layer as the first signal wiring 330.

The second signal transmitting through the second signal line 500 may have a wavelength of a predetermined operating frequency. The first and second signals of the first and second signal lines 300 and 500 may have the same predetermined operating frequency. Alternatively, the first and second signals may have different operating frequencies.

In example embodiments, the ground line 400 may be referred to as a ground line configured to provide ground in the package substrate 200. The ground line 400 may be provided in the upper insulating layer 240. The ground line 400 may include a ground via 410 at least partially penetrating the upper insulating layer 240, a ground pad 420 provided on the first upper insulating layer 242*a*, a ground wiring 430 extending from the ground pad 420 on the first upper insulating layer 242*a*, and a first ground stub 440 extending from the ground pad 420 on the first upper insulating layer 242*a*. For example, the lower conductive line 280 may include the ground line 400. The ground line 400 may be provided to have a same structure in the lower insulating layer 270 as in the upper insulating layer 240.

For example, the ground line 400 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), etc.

The ground pad 420 may be provided on the first upper insulating layer 242*a*. The ground pad 420 may be electrically connected to other ground pads through the ground via 410 or the ground wiring 430. The ground pad 420 may be provided in the same insulating layer as the first and second signal pads 320 and 520. For example, the upper substrate pad 252 contacting the solder bump 120 may be provided on the ground pad 420. A diameter D5 of the ground pad 420 may be within a range of 50 μm to 150 μm.

The ground via 410 may be provided in the first opening penetrating the first upper insulating layer 242*a*. The ground via 410 may electrically connect different ground pads provided on different insulating layers. One end of the ground via 410 may be connected to the ground pad 420 and the other end of the ground via 410 may be connected to the upper conductive pattern 230. Alternatively, the other end of the ground via 410 may be connected to the ground pad provided in the other insulating layer. For example, a diameter D6 of the ground via 410 may be within a range of 20 μm to 80 μm, e.g., the diameter D6 may be smaller than the diameter D5.

The ground wiring 430 may extend in the horizontal direction, e.g., in a direction parallel to an upper surface of the core layer 210, from the ground pad 420 inside the second upper insulating layer 242*b*. The ground wiring 430 may electrically connect the ground pad 420 to different pads provided inside the second upper insulating layer 242*b*.

The ground wiring 430 may electrically connect the ground pad 420 and the ground via 410. For example, a width T3 of the ground wiring 430 may be within a range of 10 μm to 20 μm. The ground wiring 430 may be provided in the same insulating layer as the first and second signal wirings 330 and 530.

The first ground stub 440 may provide the ground for the first signal line 300. The first ground stub 440 may provide the return path for the first signal line 300 and reduce the noise.

In detail, referring to FIG. 5, the first ground stub 440 may extend from the ground pad 420 toward the first signal via 310 or the first signal pad 320. For example, as illustrated in FIG. 5, a first end of the first ground stub 440 may be connected directly to the ground pad 420, and a second end of the first ground stub 440 (i.e., an end opposite to the first end) may not be electrically connected but may be adjacent, e.g., in close proximity, to the first signal pad 320. The first ground stub 440 may extend in a direction different from a direction in which the ground wiring 430 extends from the ground pad 420, e.g., the first ground stub 440 and the ground wiring 430 may extend in opposite directions from the ground pad 420. For example, as illustrated in FIG. 5, the ground stub 440 may extend directly from the ground pad 420 along a direction of the first signal wiring 330, e.g., the first ground stub 440 and the first signal wiring 330 may extend in parallel to each other in a direction oriented from the ground pad 420 toward the first signal pad 320. For example, as further illustrated in FIG. 5, the ground stub 440 may be spaced apart from the first signal wiring 330, e.g., a distance L1 between the first signal wiring 330 and the first ground stub 440 may be within a range of 10 μm to 15 μm.

The first ground stub 440 may provide the ground to the first signal line 300 and the second signal line 500 at the same time, e.g., due to the small distance between the first ground stub 440 and each of the first signal line 300 and the second signal line 500. The first ground stub 440 may provide the return path for the second signal line 500 and reduce the noise.

The first ground stub 440 may extend from the ground pad 420 toward the second signal via 510 or the second signal pad 520 between the first and second signal lines 300 and 500. The first ground stub 440 may extend along the second signal wiring 530 to be spaced apart from the second signal wiring 530. For example, a distance L2 between the second signal wiring 530 and the ground stub 440 may be within a range of 10 μm to 15 μm. The distance L2 between the second signal wiring 530 and the first ground stub 440 may be the same as the distance L1 between the first signal wiring 330 and the first ground stub 440.

The first ground stub 440 may provide the ground to both the first and second signal lines 300 and 500 between the first and second signal lines 300 and 500. The first ground stub 440 may simultaneously provide the return path for the first and second signal lines 300 and 500 and reduce the noise. The first ground stub 440 may provide a greater influence to a signal line positioned closer among the first and second signal lines.

A length L of the first ground stub 440 may be determined in order to prevent resonant effects. The length L of the first ground stub 440 may be limited according to the operating frequency of the first signal transmitting through the first signal line 300. The length L of the first ground stub 440 may be limited according to the operating frequency of the second signal transmitting through the second signal line 500. For example, a ratio (L/λ) of the length (L) of the first ground stub 440 to the wavelength (λ) may be within a range of 0.005 to 0.05.

A second ground stub 440a may be substantially similar to the first ground stub 440 but extend farther to surround at least one of the first signal pad 320 and the second signal pad 520 while being spaced apart therefrom. The second ground stub 440a may extend to surround at least one of the first signal via 310 and the second signal via 510 while being spaced apart therefrom. The second ground stub 440a may maximize a noise reduction by surrounding, e.g., at least part of, a circumference of the at least one of the first and second signal pads 320 and 520 or a circumference of the at least one of the first and second signal pads 320 and 520.

The second ground stub 440a may extend from a circumference of at least one of the first signal pad 320 and the first signal via 310 to a region B spaced apart by a predetermined distance L3. The second ground stub 440a may extend from a circumference of at least one of the second signal pad 520 and the second signal via 510 to the region B spaced apart by the predetermined distance L3. An extension of the second ground stub 440a to the inside of the region B spaced by the predetermined distance L3 may be restricted. The predetermined distance L3 may be within a range of 10 μm to 15 μm. For example, as illustrated in FIG. 5, a boundary of the region B (dashed circle around the second signal pad 520 in FIG. 5) may be at a distance L3 from a boundary of the second signal pad 520, such that both an end of the second signal wiring 530 and the second ground stub 440a may not cross into the region B.

A third ground stub 440b may include a main ground stub 442 and a branch ground stub 444 branching from the main ground stub 442. For example, the main ground stub 442 may extend along the first signal wiring 330 and the branch ground stub 444 may extend along the second signal wiring 530. The third ground stub 440b may maximize the noise reduction of the first and second signal wirings 330 and 530 in a wider area between the first and second signal wirings 330 and 530 via the main ground stub 442 and the branch ground stub 444. For example, the main ground stub 442 and the branch ground stub 444 may extend to surround each of the first and second signal pads 320 and 520 while spaced apart from each other.

As described above, the ground stub extending toward the first signal via 310 or the first signal pad 320 may compensate for the noise of the first signal transmitting through the first signal via 310, the first signal pad 320, or the first signal wiring 330. The ground stub may improve signal characteristics by providing the return path. In addition, it is easy to configure a combination of size, shape, arrangement, design, etc. of the ground stub according to a required degree. Compensation for the first signal may be possible even in a structure in which crosstalk easily occurs.

By way of summation and review, crosstalk between signals may distort the signals and may degrade the characteristics of the semiconductor memory module products. While maximizing a distance between wirings through which signals are transmitted has been considered to minimize crosstalk, the distance between wirings has spatial limitations.

In contrast, example embodiments provide a package substrate capable of preventing interference between signal lines. Example embodiments also provide a semiconductor package including the package substrate.

That is, according to example embodiments, a package substrate includes a ground stub extending toward the first signal via or the first signal pad, so it may compensate for the noise of the first signal moving inside the first signal via, the first signal pad, or the first signal wiring. The ground stub may improve signal characteristics by providing a return path. In addition, it is easy to configure a combination of size, shape, arrangement, design, etc. of the ground stub according to a required degree. Compensation for the first signal may be possible even in a structure in which crosstalk easily occurs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A package substrate, comprising:
   a plurality of sequentially stacked insulating layers;
   a first signal line configured to transmit a first signal therethrough, the first signal line including:
      a first signal via at least partially penetrating the plurality of insulating layers,
      a first signal pad provided at one end of the first signal via, the first signal pad being within one of the plurality of insulating layers, and
      a first signal wiring extending from the first signal pad within the one of the plurality of insulating layer; and
   a ground line including:
      a ground via at least partially penetrating the plurality of insulating layers,
      a ground pad at one end of the ground via, the ground pad being within the one of the plurality of insulating layers,
      a ground wiring extending from the ground pad within the one of the plurality of insulating layers, and
      a ground stub extending from the ground pad toward the first signal via or the first signal pad;
   wherein
   the one of the plurality of insulating layers is a topmost of the plurality of insulating layers, and
   the package substrate further includes:
   a passivation layer on the one of the plurality of insulating layers;
   a substrate pad penetrating the passivation layer; and
   a conductive bump on the substrate pad.

2. The package substrate as claimed in claim 1, wherein:
   the first signal line is configured to transmit the first signal with a wavelength of a predetermined operating frequency, and
   a ratio (L/λ) of a length (L) of the ground stub to the wavelength (λ) is within a range of 0.005 to 0.05.

3. The package substrate as claimed in claim 1, wherein the ground stub extends to surround at least one of the first signal via and the first signal pad while being spaced apart therefrom.

4. The package substrate as claimed in claim 1, wherein the ground stub extends to a region spaced apart by a predetermined distance from a circumference of at least one of the first signal via and the first signal pad, the predetermined distance being within a range of 10 μm to 15 μm.

5. The package substrate as claimed in claim 1, further comprising a second signal line configured to transmit a second signal therethrough, the second signal line including:

a second signal via at least partially penetrating the plurality of insulating layers;

a second signal pad at one end of the second signal via, the second signal pad being in the one of the plurality of insulating layers; and a second signal wiring extending from the second signal pad within the one of the plurality of insulating layers, the ground stub extending between the first signal wiring and the second signal wiring.

6. The package substrate as claimed in claim 1, wherein the ground stub includes a main ground stub and a branch ground stub branching from the main ground stub.

7. The package substrate as claimed in claim 1, wherein a thickness of the ground stub is within a range of 10 μm to 20 μm.

8. The package substrate as claimed in claim 1, wherein a distance between the first signal wiring and the ground stub is within a range of 10 μm to 15 μm.

9. The package substrate as claimed in claim 1, wherein the ground stub includes at least one of nickel, antimony, bismuth, zinc, indium, palladium, platinum, aluminum, copper, molybdenum, titanium, gold, silver, chromium, and tin.

10. A package substrate, comprising:

a plurality of sequentially stacked insulating layers;

a first signal line configured to transmit a first signal therethrough, the first signal line including a first signal via at least partially penetrating the plurality of insulating layers, a first signal pad at one end of the first signal via in any selected one of the insulating layers, and a first signal wiring extending from the first signal pad in the selected one of the plurality of insulating layers;

a second signal line configured to transmit a second signal therethrough, the second signal line including a second signal via at least partially penetrating the plurality of insulating layers, a second signal pad at one end of the second signal via in the selected one of the plurality of insulating layers, and a second signal wiring extending from the second signal pad in the selected one of the plurality of insulating layers; and a ground line including a ground via at least partially penetrating the plurality of insulating layers, a ground pad at one end of the ground via in the selected one of the plurality of insulating layers, a ground wiring extending from the ground pad in the selected one of the plurality of insulating layers, and a ground stub extending from the ground pad toward the first signal pad or the second signal pad between the first signal line and the second signal line, wherein each of the first signal and the second signal has a wavelength of a predetermined operating frequency, a ratio ($L/\lambda$) of a length (L) of the ground stub to the wavelength ($\lambda$) being within a range of 0.005 to 0.05.

11. A package substrate, comprising:

a plurality of sequentially stacked insulating layers;

a first signal line configured to transmit a first signal therethrough, the first signal line including:

a first signal via at least partially penetrating the plurality of insulating layers, a first signal pad provided at one end of the first signal via, the first signal pad being within one of the plurality of insulating layers, and a first signal wiring extending from the first signal pad within the one of the plurality of insulating layer; and a ground line including:

a ground via at least partially penetrating the plurality of insulating layers, a ground pad at one end of the ground via, the ground pad being within the one of the plurality of insulating layers, a ground wiring extending from the ground pad within the one of the plurality of insulating layers, and a ground stub extending from the ground pad toward the first signal via or the first signal pad;

wherein the ground stub extends to a region spaced apart by a predetermined distance from a circumference of at least one of the first signal via and the first signal pad, the predetermined distance being within a range of 10 μm to 15 μm.

12. The package substrate as claimed in claim 11, wherein:

the first signal line is configured to transmit the first signal with a wavelength of a predetermined operating frequency, and a ratio ($L/\lambda$) of a length (L) of the ground stub to the wavelength ($\lambda$) is within a range of 0.005 to 0.05.

13. The package substrate as claimed in claim 11, wherein the ground stub extends to surround at least one of the first signal via and the first signal pad while being spaced apart therefrom.

14. The package substrate as claimed in claim 11, further comprising a second signal line configured to transmit a second signal therethrough, the second signal line including:

a second signal via at least partially penetrating the plurality of insulating layers;

a second signal pad at one end of the second signal via, the second signal pad being in the one of the plurality of insulating layers; and a second signal wiring extending from the second signal pad within the one of the plurality of insulating layers, the ground stub extending between the first signal wiring and the second signal wiring.

15. The package substrate as claimed in claim 11, wherein the ground stub includes a main ground stub and a branch ground stub branching from the main ground stub.

16. The package substrate as claimed in claim 11, wherein a thickness of the ground stub is within a range of 10 μm to 20 μm.

17. The package substrate as claimed in claim 11, wherein a distance between the first signal wiring and the ground stub is within a range of 10 μm to 15 μm.

18. The package substrate as claimed in claim 11, wherein the ground stub includes at least one of nickel, antimony, bismuth, zinc, indium, palladium, platinum, aluminum, copper, molybdenum, titanium, gold, silver, chromium, and tin.

\* \* \* \* \*